US009841482B2

United States Patent
Fuderer et al.

(10) Patent No.: US 9,841,482 B2
(45) Date of Patent: Dec. 12, 2017

(54) ITERATIVE SENSE DENOISING WITH FEEDBACK

(71) Applicant: KONINKLIJKE PHILIPS N.V., Eindhoven (NL)

(72) Inventors: Miha Fuderer, Eindhoven (NL); Johannes Martinus Peeters, Eindhoven (NL); Adrianus Joseph Willibrordus Duijndam, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 60 days.

(21) Appl. No.: 14/421,912

(22) PCT Filed: Aug. 29, 2013

(86) PCT No.: PCT/EP2013/067885
§ 371 (c)(1),
(2) Date: Feb. 16, 2015

(87) PCT Pub. No.: WO2014/033207
PCT Pub. Date: Mar. 6, 2014

(65) Prior Publication Data
US 2015/0212180 A1   Jul. 30, 2015

Related U.S. Application Data

(60) Provisional application No. 61/694,323, filed on Aug. 29, 2012.

(51) Int. Cl.
G06K 9/00 (2006.01)
G01R 33/561 (2006.01)
G01R 33/56 (2006.01)
G01R 33/34 (2006.01)

(52) U.S. Cl.
CPC .......... *G01R 33/5611* (2013.01); *G01R 33/34* (2013.01); *G01R 33/5608* (2013.01)

(58) Field of Classification Search
USPC ............. 324/307, 309; 378/4; 382/128, 131; 600/410
See application file for complete search history.

(56) References Cited

U.S. PATENT DOCUMENTS 6,049,623 A *  4/2000  Fuderer .................... G06T 5/20
                                                          382/131
6,518,760 B2 *  2/2003  Fuderer .............. G01R 33/5611
                                                          324/307

(Continued)

FOREIGN PATENT DOCUMENTS

| CN | 102156966 A | 8/2011 |
|---|---|---|
| EP | 815535 B1 | 10/2002 |

OTHER PUBLICATIONS

Weller, Daniel S. et al, Denoising Sparse Images from GRAPPA using the Nullspace Method, Magnetic Resonance in Medicine, 2011.

(Continued)

*Primary Examiner* — Xuemei Chen

(57) ABSTRACT

A magnetic resonance imaging system (1) includes a denoising unit (24), and a reconstruction unit (20). The denoising unit (24) denoises a partial image and provides a spatially localized measure of a denoising effectivity. The reconstruction unit (20) iteratively reconstructs an output image from the received MR data processed with a Fast Fourier Transform (FFT), and in subsequent iterations includes the denoised partial image and the spatially localized measure of the denoising effectivity.

17 Claims, 2 Drawing Sheets

(56) References Cited

U.S. PATENT DOCUMENTS

Figure 1:
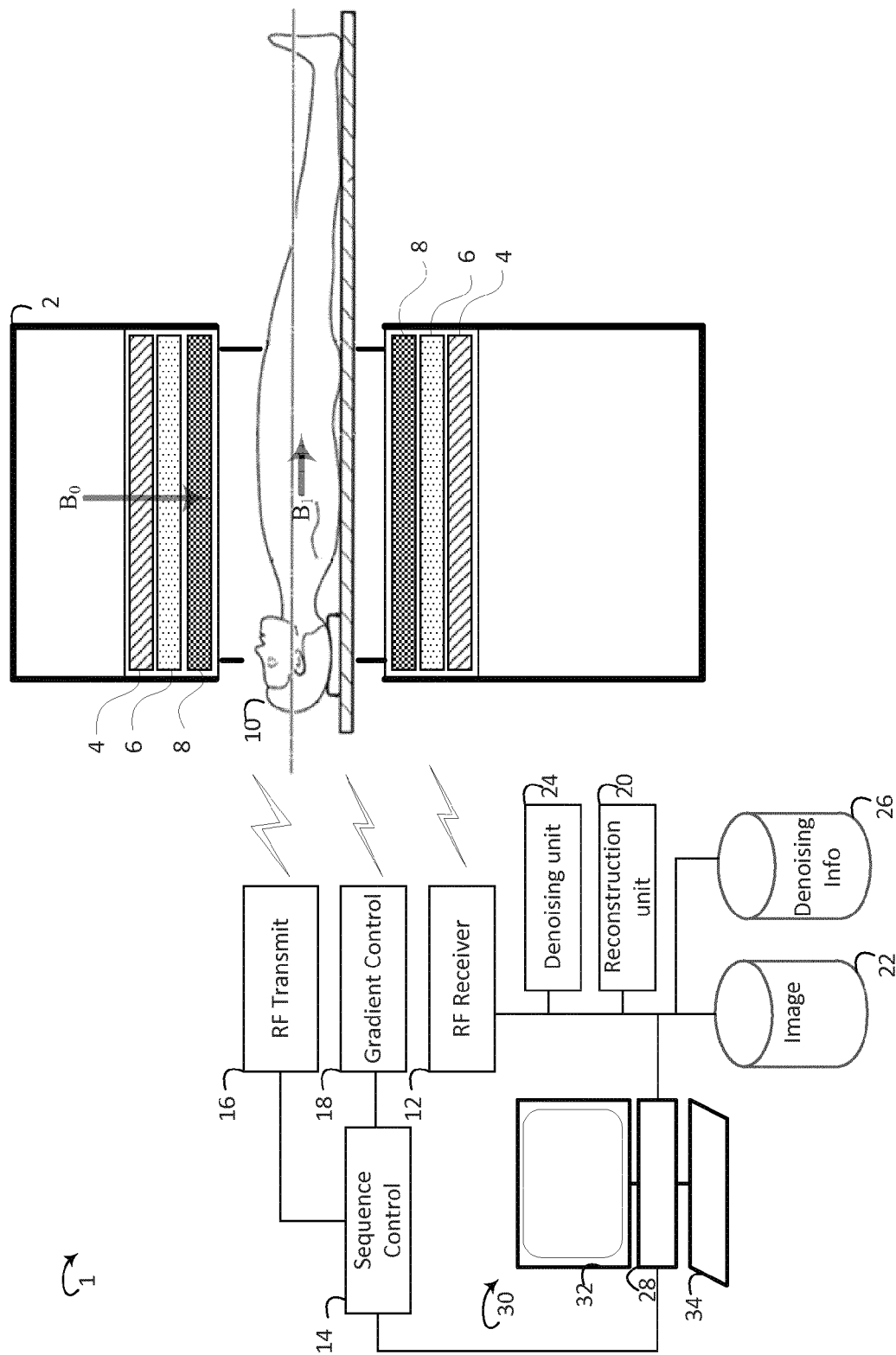

| | | | | |
|---|---|---|---|---|
| 7,053,613 | B2* | 5/2006 | Lin | G01R 33/5611 324/307 |
| 7,202,663 | B2* | 4/2007 | Huang | G01R 33/5611 324/307 |
| 7,202,666 | B2 | 4/2007 | Wang | |
| 7,309,984 | B2 | 12/2007 | Arunachalam | |
| 7,309,985 | B2* | 12/2007 | Eggers | G01R 33/5611 324/307 |
| 7,576,539 | B2 | 8/2009 | Fu | |
| 7,719,275 | B2 | 5/2010 | Fu | |
| 7,840,045 | B2 | 11/2010 | Guo | |
| 7,884,604 | B2* | 2/2011 | Kholmovski | G01R 33/5611 324/307 |
| 8,055,037 | B2* | 11/2011 | Sinop | G01R 33/5611 378/4 |
| 8,548,218 | B2* | 10/2013 | Metaxas | G01R 33/5608 382/128 |
| 8,781,243 | B2* | 7/2014 | Chen | G06T 11/005 382/131 |
| 8,886,283 | B1* | 11/2014 | Chen | A61B 5/055 382/128 |
| 8,901,927 | B2* | 12/2014 | Gross | G01R 33/5611 324/309 |
| 9,035,653 | B2* | 5/2015 | Hutter | G01R 33/5611 324/307 |
| 9,285,448 | B2* | 3/2016 | Hutter | G01R 33/561 |
| 2002/0042568 | A1* | 4/2002 | Fuderer | G01R 33/5611 600/410 |
| 2004/0207402 | A1 | 10/2004 | Kellman | |
| 2007/0055134 | A1* | 3/2007 | Fuderer | G01R 33/5611 600/410 |
| 2008/0154115 | A1* | 6/2008 | Fuderer | G01R 33/5611 600/410 |

OTHER PUBLICATIONS

Huang, F. et al "A Rapid and Robust Numerical Algorithm for Sensitivity Encoding with Sparsity Constraints: Self-Feeding Sparse SENSE" Magnetic Resonance in Medicine, vol. 64, No. 4, 2010, pp. 1078-1088.

Gerig, Guido et al "Nonlinear Anisoropic Filtering of MRI Data", IEEE Transactions on Medical Imaging, vol. 11 No. 2, 1992, pp. 221-232.

Saha, Punam K. et al "Scale-Based Diffusive Image Filtering Preserving Boundary Sharpness and Fine Structures", IEEE Transactions on Medical Imaging, vol. 20, No. 11, 2001, pp. 1140-1155.

Ying, Leslie et al "On Tlkhonov Regularization for Image Reconstruction in Parallel MRI", Proceedings of the 26th Annual International Conf. on the IEEE EMBS, Sep. 2004.

Liang, Zhi-Pei et al "Improved Image Reconstruction from Sensitivity-Encoded Data by Wavelet Denoising and Tikhonov Regularization", IEEE 2002, pp. 493-496.

King, K.F. et al "Adaptive Regularization in Compressed Sensing using the Discrepancy Principle" Proceedings of the International Society Magnetic Resonance in Medicine, vol. 17, 2009, pp. 2822.

Fang, Sheng et al "Parallel Magnetic Resonance Imaging using Wavelet-Based Multivariate Regularization", Journal of X-Ray Science and Technology, vol. 18, 2010, pp. 145-155.

Velikina, J.V. "VAMPIRE: Variation Minimizing Parallel Imaging Reconstruction", Proceedings of the International Society Magnetic Resonance in Medicine, vol. 13, 2005, pp. 2424.

Liu, Bo et al "Regularized Sensitivity Encoding (SENSE) Reconstruction using Bregman Iterations", Magnetic Resonance in Medicine, vol. 61, 2009, pp. 145-152.

Guo, Weihong et al "A Local Mutual Information Guided Denoising Technique and its Application to Self-Calibrated Partially Parallel Imaging", Medical Image Computing and Computer-Assisted Intervention A MICCAI 2008, pp. 939-947.

Lee, Gregory R. et al "Image Reconstruction from 3D Non-Cartesian Data Employing a Combined COnjugate Gradient and Denoising Algorithm", Proceedings of the International Society Magnetic Resonance in Medicine, vol. 20, 2012, pp. 2257.

Pruessmann, Klaas et al "Advances in Sensitivity Encoding with Arbitrary k-Space Trajectories", Magnetic Resonance in Medicine, vol. 46, 2001, pp. 638-651.

* cited by examiner

ITERATIVE SENSE DENOISING WITH FEEDBACK

CROSS-REFERENCE TO PRIOR APPLICATIONS

This application is the U.S. National Phase application under 35 U.S.C. §371 of International Application No. PCT/EP2013/067885, filed on Aug. 29, 2013, which claims the benefit of U.S. Provisional Patent Application No. 61/694,323, filed on Aug. 29, 2012. These applications are hereby incorporated by reference herein.

The following relates generally to medical imaging. It finds particular application in conjunction with magnetic resonance (MR) imaging, MR image reconstruction, and image filtering techniques, and will be described with particular reference thereto. However, it will be understood that it also finds application in other usage scenarios and is not necessarily limited to the aforementioned application.

In MR imaging, raw MR data is received from one or more receiving coils which measure MR signal from tissues of a subject. The receiving coils can include multi-channel receiving coils which include a spatial overlap in the MR data such as parallel imaging.

In multi-channel MR scanners, the known art proposes iterative combinations of denoising and parallel imaging reconstruction such as sensitivity encoding (SENSE), generalized autocalibrating partially parallel acquisitions (GRAPPA), and the like, which iteratively reconstruct an image. Feng et. al., "A Rapid and Robust Numerical Algorithm for Sensitivity Encoding with Sparsity Constraints: Self-Feeding Sparse SENSE", Magnetic Resonance in Medicine 64:1078-1088 (2010). Each iteration generates a partially reconstructed image using the multiple channels of received MR data as input. Typically, between iterations of the iterative reconstruction, the partially reconstructed image is passed through a denoising filter. The denoising filter inputs the generated image, and outputs a denoised image. The denoised image is substituted for the input generated image by the next iterative reconstruction. No further information is made available to the iterative reconstruction algorithm regarding the success of or change by the denoising process.

The following discloses a new and improved iterative parallel imaging denoising filter with feedback which addresses the above referenced issues, and others.

In accordance with one aspect, a magnetic resonance imaging system includes a denoising unit, and a reconstruction unit. The denoising unit denoises a partially reconstructed image and provides a measure of a denoising effectivity. The reconstruction unit iteratively reconstructs received parallel MR data with a parallel imaging reconstruction technique and, in subsequent iterations, the denoised partially reconstructed image and the measure of the denoising effectivity to generate an output image.

In accordance with another aspect, a method of magnetic resonance imaging includes denoising a partially reconstructed image and providing a measure of an effectivity of the denoising. The partially reconstructed image is iteratively reconstructed based on received parallel MR data, the denoised partially reconstructed image and the measure of effectivity from the denoising.

In accordance with another aspect, a magnetic resonance imaging system includes one or more processors and a display. The one or more processors are configured to receive parallel magnetic resonance (MR) data, and reconstruct the MR data into a partial image. The one or more processors are further configured to denoise the partial image and provide a spatially localized measure of an effectivity of the denoising, and iteratively reconstruct an output image using a parallel reconstruction technique based on the MR data, the denoised partial image, and the spatially localized measure of the effectivity of the denoising. The display displays the output image.

One advantage is information from the denoising filter is used to improve the parallel image reconstruction.

Another advantage resides in improved image quality.

Another advantage resides in the reuse of existing hardware and software.

Another advantage resides in the applicability to the spatial overlap in MR data of multi-channel systems.

Still further advantages will be appreciated to those of ordinary skill in the art upon reading and understanding the following detailed description.

The invention may take form in various components and arrangements of components, and in various steps and arrangement of steps. The drawings are only for purposes of illustrating the preferred embodiments and are not to be construed as limiting the invention.

FIG. 1 schematically illustrates an embodiment of the iterative SENSE denoising with feedback system.

Figure 2:
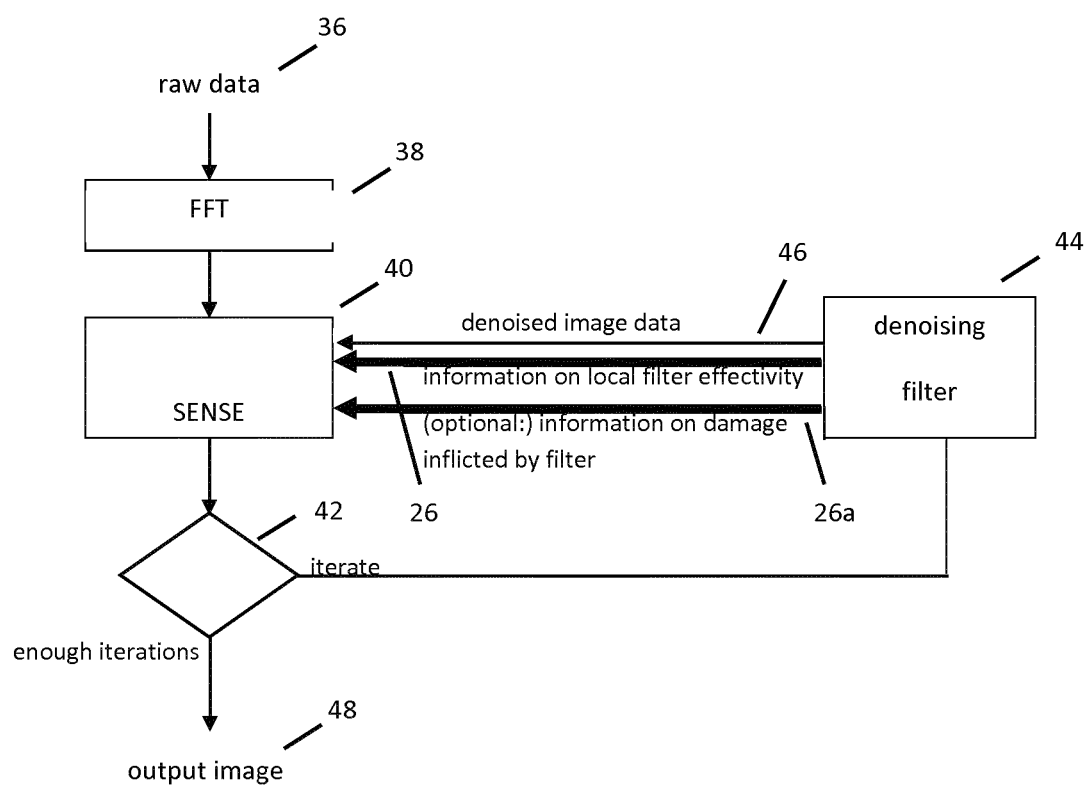

FIG. 2 flowcharts one method of using an embodiment of the iterative SENSE denoising with feedback.

With reference to FIG. 1, an embodiment of the iterative parallel imaging such as SENSE, with feedback system 1 is schematically illustrated. The system 1 includes a magnetic resonance (MR) scanning device 2 such as a horizontal bore, open system, c-type bore, combination and/or hybrid MR scanner. The MR scanning device 2 includes a main magnet 4, one or more gradient coils 6, and one or more radio frequency (RF) coils 8. The main magnet 4 generates a static magnetic field or $B_0$ field such as a vertical or horizontal oriented field. The RF coils 8 excite and manipulate magnetic resonance in a subject 10. The RF coil includes multi-channel coils or coils with a plurality of coil elements. The RF coil can include a whole body coil with a plurality of independently driven coil elements for transmit parallel imaging. The RF coil can include one or more local coils such as head coil, chest coil, prostate coil, knee coil, leg coil, and the like. The RF coil can operate in a transmit mode which excites the magnetic resonance, or in a receive mode which measures the MR signal in the subject and transmit the MR data to a plurality of RF receivers 12 for receive parallel imaging. The gradient coils 6 manipulate and focus the magnetic resonance. SENSE imaging can include a plurality of channels, such as 8, 16, 32, or the like.

The system includes a sequence control 14, an RF transmit control 16, and a gradient control 18. The sequence control controls and coordinates the RF transmit control and the gradient control. The RF transmit control controls the configuration and timing of the RF coils such as the power, duration, and phase of the RF pulses used to excite magnetic resonance, and the receiving of the MR signal. The gradient control controls the application of the gradient fields by the gradient coils.

The system includes a reconstruction unit 20 which reconstructs MR data received by the RF receivers 12 with a parallel imaging reconstruction technique. A Fourier transform (FFT) converts the data from the time domain or data space to the spatial domain or image space. The reconstruction unit iteratively reconstructs the plurality of parallel Fourier transform data into an image which is stored in an image memory 22. The reconstruction unit uses a parallel reconstruction algorithm such as SENSE, GRAPPA, and the like. The parallel reconstruction uses coil sensitivity maps, and the spatial overlap of the sets of data received by the coil elements to determine data folding locations. For example, an initial reconstruction inputs the MR data to construct a first noisy partial reconstructed image from the MR data. The first image is revised based on the MR data in each iteration until a minimum threshold of change or a threshold number of iterations is reached. When the threshold is met, the final partial reconstruction image is output as the diagnostic image. The system includes a denoising unit 24 which inputs the partially reconstructed image from the reconstruction unit, identifies levels and locations of noise, and removes noise from the partial reconstruction image before the next reconstruction iteration, e.g. filters the partial reconstruction image.

For example, a SENSE reconstruction can be described by $\hat{p}_{i+1}=(S^h\Psi^{-1}S+\hat{\Delta}_i^{-1})^{-1}(S^h\Psi^{-1}m+\hat{\Delta}_i^{-1}(\hat{p}_i+(I-\hat{F}_i)^{-1}(\hat{p}_{if}-\hat{p}_i)))$, whereby the $\hat{\Delta}_i$ are calculated as $\hat{\Delta}_i=(S^h\Psi^{-1}S+\hat{\Delta}_{i-1}^{-1})^{-1}\hat{\Delta}_{i-1}^{-1}(S^h\Psi^{-1}S+\hat{\Delta}_{i-1}^{-1})^{-1}+(I-\hat{F}_i)^{-1}\hat{D}_i(I-\hat{F}_i)^{-1}$, with initial value $\hat{\Delta}_0=R$ (the "regularization matrix", which is an indication of a-priori knowledge on tissue-presence). The symbol $\hat{D}_i$ represents the knowledge on the "damage inflicted by the filter". If that is unknown, it can be estimated as $\hat{D}_i=(I-F_i)F_i\cdot\text{diag}(C_i)$, with $C_i=(S^h\Psi^{-1}S+\hat{\Delta}_{i-1}^{-1})^{-1}(S^h\Psi^{-1}S)(S^h\Psi^{-1}S+\hat{\Delta}_{i-1}^{-1})^{-1}$. In these expressions, p can be the calculated pixel value, with initial value $p_0=0$, and $\hat{p}_i$ its estimate after the i-th SENSE iteration; $\hat{p}_{if}$ is the result after denoising thereof. S is the coil sensitivity, the superscript h refers to a hermitian conjugate; $\Psi$ is the noise covariance in the original data m, F is the estimate of the filter effectivity expressed as a matrix, and m=Sp+n or the data as measured expressed as a vector over the number of coil elements. One may choose to simply the expression by approximating $\Psi$ as a diagonal matrix or the identity matrix. The estimate of the locally achieved noise reduction can be expressed in the diagonal element of F as a relative measurement.

According to another aspect of the present invention, the first iteration of a SENSE reconstruction can alternatively be described by $p_2=p_{if}+(S^h\Psi^{-1}S+(FC_1F)^{-1})^{-1} S^h\Psi^{-1}(m-Sp_{if})$ where $p_2$ is the image after one iteration, $p_{1f}$ is the initial image $p_1$ after denoising by the filter f, S is the coil sensitivity map and $S^h$ is the Hermitian transpose of S, F is the estimate of the filter effectivity expressed as a matrix, $\Psi$ is the noise covariance matrix that expresses covariances between the noise of the measured data, and m=Sp+n or the data as measured expressed as a vector over the number of coil elements. $C_1$ can be approximated as $C_1=(S^h\Psi^{-1}S)^{-1}$, or, more precisely, as $C_1=(S^h\Psi^{-1}S+\hat{\Delta}_0^{-1})^{-1}(S^h\Psi^{-1}S)(S^h\Psi^{-1}S+\hat{\Delta}_0^{-1})^{-1}$. One may choose to simplify the expression by approximating $\Psi$ as a diagonal matrix or the identity matrix. The estimate of the locally achieved noise reduction can be expressed in the diagonal element of F as a relative measurement or include the diagonal element of $C_1$ as an absolute measurement, e.g. by directly providing $(FC_1F)^{-1}$.

The denoising unit 24 includes a filter to remove noise from the partially reconstructed image. The denoising unit can use denoising filters such as directional adaptive noise and artifact reduction filter, e.g. a filter sold under the tradename PicturePlus™ (see, e.g., EP0815535), and the like. The denoised image is substituted for the partially reconstructed image. The denoising unit includes a measure of the effectiveness of the denoising filter processing as feedback which is stored in a denoising information memory 26. Optionally, the denoising filter can provide information on a level of damage inflicted by the denoising filter 26a. The measure of effectiveness can include an estimate of a locally achieved level of denoising. This can pertain to situations where the process of reconstructing an MR image (or image series) has resulted in the following situation: the noise at any point in the image is correlated with the noise at a discrete set of distant points in that image. The word "distant" is to exclude the situation where the noise of a point correlates with the noise in its immediate neighborhood, which is usually the case in all MR images.

Such a situation can occur in practice if the image is a result of a parallel-imaging reconstruction of data that has been regularly subsampled in measurement space. Most frequent examples of such processing are called SENSE and GRAPPA. The "discrete set of distant points" then refers to points that are each one folding-distance apart, which is typically the field-of-view divided by the reduction-factor; we can also express it as 1/k-space-step of the acquisition. Typically, that distance is around 100 mm.

According to an aspect of the present invention, in a second iteration of the image-formation, the processing result on one point is made dependent on the information of the filter-effectivity on the "other" points, i.e., those points that have correlated noise to the one point. $\hat{F}_i$ can represent the "local filter ineffectivity of the denoising". Here, the "information on filter-effectivity" can be expressed in following forms:

For every location, an estimate on how much noise has been removed by the denoising-filter (either in a relative or in an absolute sense). This can be expressed as (the diagonal element of) $\hat{F}$ ('relative'), resp. the root of the diagonal element of $C_1$ times the diagonal element of $\hat{F}$ ('absolute').

For every location, an estimate on how much noise remains after the denoising-filter.

A new estimate of noise covariances after the denoising-filter operation, e.g., as $\hat{F}C_1\hat{F}$, or directly as $(\hat{F}C_1\hat{F})^{-1}$.

For every location, an estimate on how much information on anatomical structure has been removed (or damaged, affected) by that denoising-filtering processing (or the inverse thereof, i.e. how much remains unaffected).

That information can often be extracted from the (algorithm of the) denoising operation.

Examples thereof are provided:

With reference to Guido Gerig, Olaf Kübler, Ron Kikinis and Ferenc A. Jolesx, *Nonlinear Anisotropic Filtering of MRI Data*, IEEE-TMI, vol 11(2), 221-232 (1992) ("Gerig"), the filter ineffectivity can correspond to $(1-\Delta t\cdot\Sigma c)$, where $\Sigma c$ can be shorthand for $$c\left(x+\frac{\Delta x}{2}, y, t\right)+c\left(x-\frac{\Delta x}{2}, y, t\right)+c\left(x, y+\frac{\Delta y}{2}, t\right)+c\left(x, y-\frac{\Delta y}{2}, t\right),$$

and the function c is defined by equation (2) or (3) of the cited document.

With reference to Punam K. Saha, Jayaram K. Udupa, *Scale-Based Diffusive Image Filtering Preserving Boundary Sharpness and Fine Structures*, IEEE-TMI, vol. 20(11), 1140-1155 (2001) ("Saha"), referring to eq. (8) of the cited document, the filter ineffectivity can be seen as $$\frac{1}{\sqrt{\sum_{e\in B_{r(c),N}(c)} w_c^2(c, e, v)}}.$$

With reference to EP815535 ("Aach"), the filter ineffectivity can be linked to 1−w, where w is the average of the two vector elements of $w_r$, as expressed at the end of column 9 (paragraph 0035) of the cited document.

The measure of effectiveness can include an estimate of how much noise remains. The measure of effectiveness can also include an estimate of local structure degradation. For example, the estimate can include the amount at each location of an anatomical structure removed, damaged, and/or affected. In another example the estimate includes the amount of anatomical structure at each spatial position that is preserved and/or unaffected. In another example, for every location, an estimate on how much noise has been removed by the denoising-filter (either in a relative or in an absolute sense) can be provided. In yet another example, for every location, an estimate on how much noise remains after the denoising-filter can also be provided. Alternatively, the measure of effectiveness can include a new estimate of noise covariances after the denoising-filter operation. Additionally, for every location, an estimate on how much information on anatomical structure has been removed (or damaged, affected) by that denoising-filtering processing (or the inverse thereof, i.e. how much remains unaffected) can also be provided. The denoising information F can be represented as a matrix of values such as a range between 0 and 1 for each image location where a value of zero represents all noise being removed from the image location to a value of one representing no change to the partially reconstructed image. The reconstruction unit 20 uses the information about the effectiveness of the filter to adjust the parallel reconstruction such as revising the regularization estimate, adding an additional channel of data to the parallel reconstruction, and the like. The filtering can be increased in noisy regions and decreased in noise free regions.

The system includes one or more processors 28 such as in a workstation 30. The workstation 30 includes the electronic processor or electronic processing device 28, the display 32 which displays the image, menus, panels, and user controls, and the at least one input device 34 which inputs the healthcare practitioner selections. The workstation 30 can be a desktop computer, a laptop, a tablet, a mobile computing device, a smartphone, and the like. The input device 34 can be a keyboard, a mouse, a microphone, and the like. The display 32 includes a computer monitor, a television screen, a touch screen, tactile electronic display, Cathode ray tube (CRT), Storage tube, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and the like.

The reconstruction unit 20 and the denoising unit 24 are suitably embodied by an electronic data processing device, such as the electronic processor or electronic processing device 28 of the workstation 30, or by a network-based server computer operatively connected with the workstation 30 by a network, or so forth. The reconstruction unit 20 is adaptable to distributed processing techniques such as distributed processors or multi-core processors. Moreover, the FFT, parallel reconstruction and denoising techniques are suitably implemented using a non-transitory storage medium storing instructions (e.g., software) readable by the electronic data processing device and executable by the electronic data processing device to perform the disclosed FFT, parallel reconstruction, and denoising techniques.

With reference to FIG. 2, one method of using an embodiment of the iterative parallel reconstruction with denoising feedback is flowcharted. In a step 36, MR data is received by the RF receivers 12. The MR data includes multi-channel MR data from the RF coils 8. The MR data is transformed to image space, e.g. with a FFT, in a step 38 by the one or more processors 28.

The MR data processed by the FFT is partially reconstructed by the reconstruction unit 20 in a step 40. The reconstruction unit 20 partially reconstructs the image stored in a memory 22 using parallel reconstruction techniques such as SENSE, GRAPPA and the like. The initial reconstruction generates the image from the FFT processed MR data. Subsequent iterations revise the image based on the FFT transformed MR data, the image after denoising, and feedback from the denoising unit 24. The feedback from the denoising can be used to revise the regularization estimate. The feedback can be included in the parallel reconstruction technique as an additional channel of data. The decision to iterate the reconstruction is performed in a step 42. The decision is based on the parallel reconstruction technique employed and uses a threshold minimum change in the image or a threshold number of iterations.

The image from the parallel reconstruction is filtered for noise by the denoising unit 24. The denoising filter denoises the image and provides a spatially localized measure of the filter effectiveness. The measure of effectiveness provides the feedback to the reconstruction unit 20. The measures of effectiveness or filter effectivity can include estimates of local achieved levels of denoising. The measures can include estimates of local structure degradation. The measure can be expressed as a matrix of values.

The image from the parallel reconstruction can be displayed on the display 32 or store in a storage management system such as a Picture Archiving and Communication System (PACS), Radiology Information System (RIS), and the like.

It is to be appreciated that in connection with the particular illustrative embodiments presented herein certain structural and/or function features are described as being incorporated in defined elements and/or components. However, it is contemplated that these features may, to the same or similar benefit, also likewise be incorporated in other elements and/or components where appropriate. It is also to be appreciated that different aspects of the exemplary embodiments may be selectively employed as appropriate to achieve other alternate embodiments suited for desired applications, the other alternate embodiments thereby realizing the respective advantages of the aspects incorporated therein.

It is also to be appreciated that particular elements or components described herein may have their functionality suitably implemented via hardware, software, firmware or a combination thereof. Additionally, it is to be appreciated that certain elements described herein as incorporated together may under suitable circumstances be stand-alone elements or otherwise divided. Similarly, a plurality of particular functions described as being carried out by one particular element may be carried out by a plurality of distinct elements acting independently to carry out individual functions, or certain individual functions may be split-up and carried out by a plurality of distinct elements acting in concert. Alternately, some elements or components otherwise described and/or shown herein as distinct from one another may be physically or functionally combined where appropriate.

In short, the present specification has been set forth with reference to preferred embodiments. Obviously, modifications and alterations will occur to others upon reading and understanding the present specification. It is intended that the invention be construed as including all such modifications and alterations insofar as they come within the scope of the appended claims or the equivalents thereof. That is to say, it will be appreciated that various of the above-disclosed and other features and functions, or alternatives thereof, may be desirably combined into many other different systems or applications, and also that various presently unforeseen or unanticipated alternatives, modifications, variations or improvements therein may be subsequently made by those skilled in the art which are similarly intended to be encompassed by the following claims.

What is claimed is:

1. A magnetic resonance imaging system comprising:
a denoising unit configured to denoise a partially reconstructed image and provide a measure of a denoising effectivity, the measure including a matrix of values which represent the amount of noise removed for each partially reconstructed image location, the denoising effectivity comprising an estimate of a local amount of information relating to anatomical structure that has been removed, or damaged, or affected by the denoising unit; and
a reconstruction unit configured to iteratively reconstruct received parallel magnetic resonance (MR) data with a parallel imaging reconstruction technique which generates partially reconstructed images and denoises the partially reconstructed images with the matrix during the iterative reconstructing to generate an output image.

2. The system according to claim 1, wherein the iterative reconstruction includes sensitivity encoding (SENSE).

3. The system according to claim 1, wherein the measure includes an estimate of a locally achieved level of denoising.

4. The system according to claim 1, wherein the measure revises a regularization estimate of the iterative reconstruction.

5. The system according to claim 4, wherein the iterative reconstruction includes the measure as an additional input channel.

6. The system according to claim 1, wherein the received magnetic resonance (MR) data includes magnetic resonance (MR) data from a plurality of folded locations.

7. A method of magnetic resonance imaging, comprising:
receiving magnetic resonance (MR) data including multi-channel MR data from a plurality of radio frequency (RF) coils;
reconstructing the magnetic resonance (MR) data using a parallel reconstruction technique, wherein an initial reconstruction generates a partially reconstructed image;
denoising the partially reconstructed image and providing a spatially localized measure of an effectivity of the denoising, the spatially localized measure including an estimate of an amount of information on anatomical structure that has been removed, or damaged, or affected by the denoising for each of a plurality of locations in the partially reconstructed image; and
iteratively reconstructing the partially reconstructed image based on the received magnetic resonance (MR) data, the denoised partially reconstructed image and the spatially localized measure of effectivity of the amount of information that has been removed, or damaged, or affected by the denoising to generate an output image.

8. The method according to claim 7, wherein iterative reconstructing includes sensitivity encoding (SENSE).

9. The method according to claim 7, further including: displaying the output image.

10. The method according to claim 7, wherein denoising includes:
estimating local structure degradation.

11. A method of magnetic resonance (MR) imaging comprising:
receiving multi-channel magnetic, resonance (MR) data:
generating a partially reconstructed image from the multi-channel MR data using a parallel reconstruction technique;
denoising the partially reconstructed image and providing a measure of an amount of noise removed for each of a plurality of image locations;
constructing a matrix of values which represent the amount of noise removed for each image location; and
iteratively reconstructing the multi-channel magnetic resonance (MR) data with a parallel reconstruction technique using the matrix of values to generate an output image.

12. The method according to claim 11, further including: revising a regularization estimate of the iterative reconstruction based on the denoising.

13. The method according to claim 11, further including: displaying the output image on a display device.

14. A non-transitory computer-readable storage medium carrying software which provides control signals to one or more electronic data processing devices to:
receive magnetic resonance (MR) data including multi-channel MR data from a plurality of radio frequency (RF) coils;
reconstruct the magnetic resonance (MR) data using a parallel reconstruction technique, wherein an initial reconstruction generates a partially reconstructed image;
denoise the partially reconstructed image;
provide a matrix of spatially localized estimates of amounts of information on anatomical structure that has been removed, or damaged, or affected by the denoising; and
iteratively reconstruct the partially reconstructed image based on the received magnetic resonance (MR) data, the denoised partially reconstructed image and the spatially localized estimates to generate an output image.

15. A magnetic resonance imaging system, comprising:
one or more processors configured to:
receive parallel magnetic resonance (MR) data;
reconstruct the magnetic resonance (MR) data into a partial image;
denoise the partial image;
provide a spatially localized measure of an effectivity of the denoising, which comprises spatially localized estimate of an amount of information on anatomical structure that has been removed, or damaged, or affected by the denoising for each of a plurality of locations in the partial image; and
iteratively reconstruct an output image using a parallel reconstruction technique based on the received magnetic resonance (MR) data, the denoised partial image, and the spatially localized estimate of the amount of information on anatomical structure that has been removed, or damaged, or affected by the denoising, and
a display configured to display the output image.

16. The magnetic resonance imaging system according to claim 15, wherein the one or more processors are configured to perform the iterative reconstruction in accordance with:

$$\hat{p}_{i+1}=(S^{h}\Psi^{-1}S+\hat{\Delta}_i^{-1})^{-1}(S^{h}\Psi^{-1}m+\hat{\Delta}_i^{-1}(\hat{p}_i+(I-\hat{F}_i)^{-1}(\hat{p}_{if}-\hat{p}_i))),$$

where $\hat{p}_{i+1}$ is the next iteration image of $\hat{p}_i$, S is a coil sensitivity matrix, $S^h$ is the Hermitian transpose of S, $\Psi$ is a noise covariance matrix, m is the data as measured expressed as a vector over a number of coil elements, I is an identity matrix, $\hat{F}_i$ is an estimate of a denoising filter effectivity, $\hat{p}_{if}$ is the result after denoising, $$\hat{\Delta}_i = (S^h\Psi^{-1}S+\hat{\Delta}_{i-1}^{-1})^{-1}\hat{\Delta}_{i-1}^{-1}(S^h\Psi^{-1}S+\hat{\Delta}_{i-1}^{-1})^{-1} + (I-\hat{F}_i)^{-1}\hat{D}_i(I-\hat{F}_i)^{-1}, \hat{D}_i=(I-\hat{F}_i)\hat{F}_i \cdot \text{diag}(C_i), \text{ and } C_i = (S^h\Psi^{-1}S+\hat{\Delta}_{i-1}^{-1})^{-1}(S^h\Psi^{-1}S)(S^h\Psi^{-1}S+\hat{\Delta}_{i-1}^{-1})^{-1}.$$

17. The magnetic resonance system according to claim 15, wherein the spatially localized estimate of the amount of information on anatomical structure that has been removed, or damaged, or affected by the denoising is presented as a matrix.

* * * * *